(12) United States Patent
Lee et al.

(10) Patent No.: US 8,698,276 B2
(45) Date of Patent: Apr. 15, 2014

(54) SEMICONDUCTOR DEVICE HAVING A PLURALITY OF REPAIR FUSE UNITS

(75) Inventors: Jeong-Woo Lee, Gyeonggi-do (KR);
Hyung-Dong Lee, Gyeonggi-do (KR);
Sang-Hoon Shin, Gyeonggi-do (KR);
Hyang-Hwa Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 280 days.

(21) Appl. No.: 13/338,716

(22) Filed: Dec. 28, 2011

(65) Prior Publication Data

US 2012/0092062 A1    Apr. 19, 2012

Related U.S. Application Data

(63) Continuation-in-part of application No. 12/649,452, filed on Dec. 30, 2009, now Pat. No. 8,110,892.

(30) Foreign Application Priority Data

Jul. 10, 2009    (KR) ........................ 10-2009-0062905

(51) Int. Cl.
*H01L 23/52*    (2006.01)
(52) U.S. Cl.
USPC ........... 257/529; 257/774; 257/776; 257/686; 257/777; 438/109; 438/667

(58) Field of Classification Search
USPC ......... 257/774, 776, 529, 773, 678, 686, 723, 257/777; 438/629, 637, 639, 667, 672, 675, 438/106, 109, 110
See application file for complete search history.

(56) References Cited

U.S. PATENT DOCUMENTS

| | | | |
|---|---|---|---|
| 7,111,149 B2 * | 9/2006 | Eilert | 711/220 |
| 2008/0220565 A1 * | 9/2008 | Hsu et al. | 438/109 |
| 2009/0003103 A1 * | 1/2009 | Shimizu et al. | 365/201 |
| 2011/0110064 A1 * | 5/2011 | Foster et al. | 361/803 |

* cited by examiner

*Primary Examiner* — Thanh Y Tran
(74) *Attorney, Agent, or Firm* — IP & T Group LLP

(57) ABSTRACT

A semiconductor system includes a controller; a semiconductor device comprising a plurality of stacked semiconductor chips stacked over the controller, and a plurality of through-silicon vias (TSVs) configured to commonly transfer a signal to the plurality of stacked semiconductor chips; and a defect information transfer TSV configured to transfer TSV defect information sequentially outputted from at least one of the semiconductor chips to the controller, wherein the controller comprises: a plurality of first repair fuse units configured to set first fuse information based on the TSV defect information; and a plurality of first TSV selection units configured to selectively drive the TSVs in response to the first fuse information.

21 Claims, 5 Drawing Sheets

SEMICONDUCTOR DEVICE HAVING A PLURALITY OF REPAIR FUSE UNITS

CROSS-REFERENCE TO RELATED APPLICATIONS

This application is a continuation-in-part of U.S. patent application Ser. No. 12/649,452 filed on Dec. 30, 2009 now U.S. Pat. No. 8,110,892, which claims priority of Korean Patent Application No. 10-2009-0062905, filed on Jul. 10, 2009. The disclosure of each of the foregoing applications is incorporated herein by reference in its entirety.

BACKGROUND OF THE INVENTION

Exemplary embodiments of the present invention relate to a semiconductor design technology, and more particularly, to a technology which processes information indicating whether through chip vias are defective.

In order to highly integrate a semiconductor device, various types of package methods have been proposed. In a chip stack method in which a plurality of semiconductor chips are stacked to form a semiconductor device, a through-chip-via is used to commonly transfer a signal to a plurality of semiconductor chips. In general, since semiconductor chips are fabricated of a silicon wafer, the through-chip-via is also called a Through-Silicon-Via (TSV).

When a defect occurs in a TSV, a repair operation is performed to substitute a normal TSV with a redundant TSV. The defect information of the TSV is desired to be provided to an internal circuit, in order to ensure normal operations of the semiconductor device. In other words, the internal circuit of the semiconductor device receiving information as to the defect selectively drives TSVs which may transfer a signal, among the plurality of SVs. That is, the internal circuit selectively drives the redundant TSVs and the normal TSVs. Therefore, the semiconductor device fabricated by the chip stack method is desired to be provided with a circuit capable of effectively transferring information as to defects of the TSVs.

SUMMARY OF THE INVENTION

An embodiment of the present invention is directed to a semiconductor device which stores defect information of TSVs outputted from repair fuse units into a plurality of latch units.

Another embodiment of the present invention is directed to a semiconductor system comprising a semiconductor device which stores defect information of TSVs outputted from repair fuse units into a plurality of latch units, and sequentially transfers the defect information through a defect information transfer TSV, and a controller which sets up its fuse information based on the sequentially transferred defect information, and selectively drives the TSVs in response to the fuse information.

In accordance with an embodiment of the present invention, a semiconductor system includes: a controller; a semiconductor device comprising a plurality of stacked semiconductor chips stacked over the controller, and a plurality of through-silicon vias (TSVs) configured to commonly transfer a signal to the plurality of stacked semiconductor chips; and a defect information transfer TSV configured to transfer TSV defect information sequentially outputted from at least one of the semiconductor chips to the controller, wherein the controller comprises: a plurality of first repair fuse units configured to set first fuse information based on the TSV defect information; and a plurality of first TSV selection units configured to selectively drive the TSVs in response to the first fuse information.

In accordance with another embodiment of the present invention, a semiconductor system includes: a controller; and a semiconductor device comprising a plurality of stacked semiconductor chips stacked over the controller, and a plurality of through-silicon vias (TSVs) configured to commonly transfer a signal to the plurality of stacked semiconductor chips, wherein at least one of the semiconductor chips comprises a plurality of first repair fuse units configured to set first fuse information corresponding to a TSV defect information, and sequentially outputs the TSV defect information, and the controller comprises a plurality of second repair fuse units configured to set second fuse information based on the sequentially outputted TSV defect information, and selectively drives the TSVs in response to the second fuse information.

DESCRIPTION OF SPECIFIC EMBODIMENTS

Figure 1:
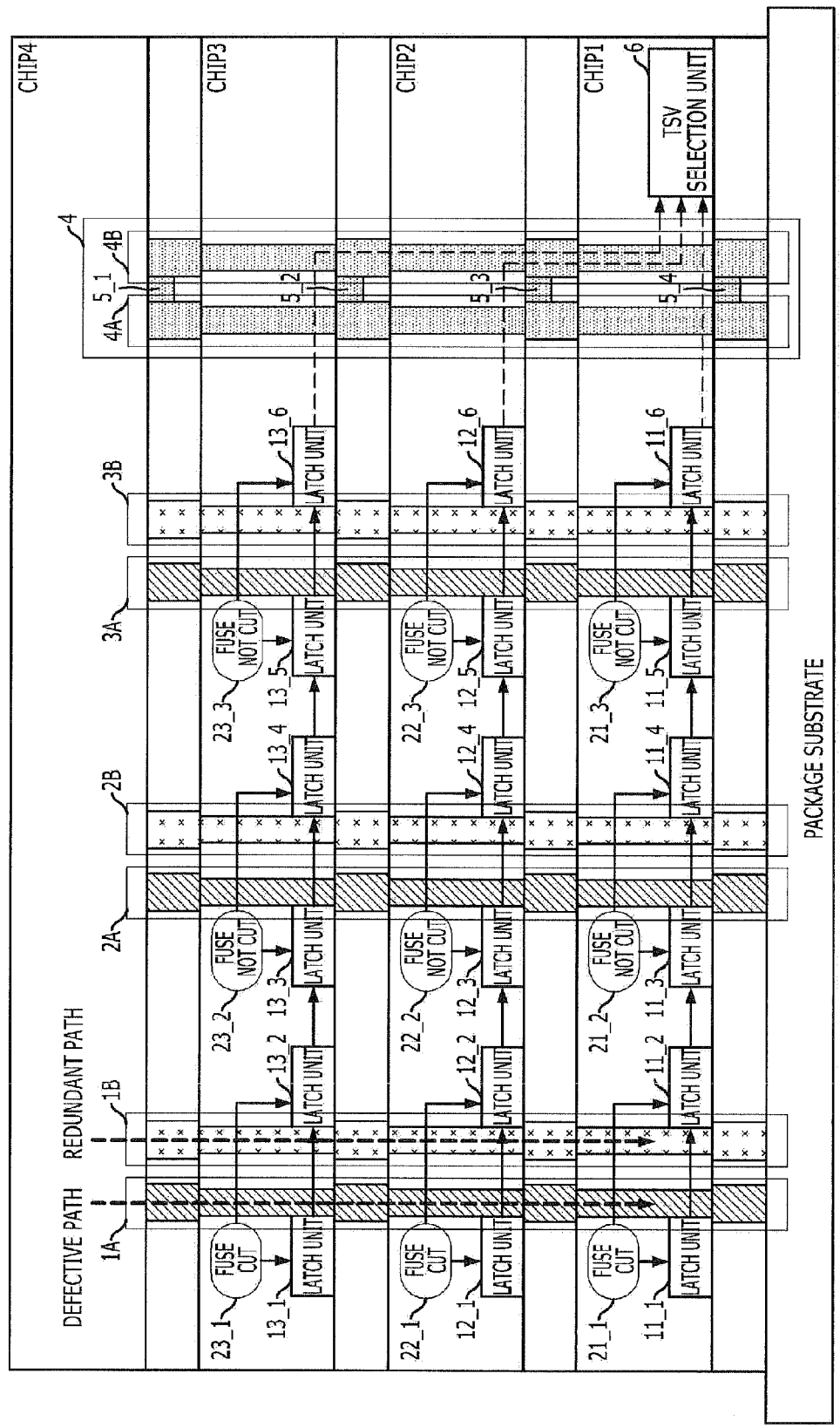
FIG. 1 is a diagram conceptually illustrating the cross section of a semiconductor device in accordance with a first embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In general, logic signals and binary data of a circuit have a high level or a low level, depending on the logic levels thereof, and may be represented by "1" or "0". Furthermore, the logic signals and data may have a high-impedance (Hi-Z) state, if necessary.

FIG. 1 is a diagram conceptually illustrating the cross section of a semiconductor device in accordance with a first embodiment of the present invention.

Referring to FIG. 1, the semiconductor device includes a plurality of stacked semiconductor chips CHIP1 to CHIP4, a plurality of normal TSVs 1A to 3A, a plurality of redundant TSVs 1B to 3B, a plurality of repair fuse units 21_1 to 21_3, 22_1 to 22_3, and 23_1 to 23_3, and a TSV selection unit 6. The plurality of TSVs 1A-1B, 2A-2B, and 3A-3B are configured to commonly transfer a signal to the plurality of semiconductor chips CHIP1 to CHIP4. The plurality of repair fuse units 21_1 to 21_3, 22_1 to 22_3, and 23_1 to 23_3 are provided in the respective semiconductor chips to store information as to defects in the TSVs. The TSV selection unit 6 is configured to selectively drive the plurality of TSVs 1A-1B, 2A-2B, and 3A-3B in accordance with the defect information of the repair fuse units 21_1 to 21_3, 22_1 to 22_3, and 23_1 to 23_3. In this case, the TSV selection unit 6 selectively drives redundant TSVs and normal TSVs.

The plurality of stacked semiconductor chips CHIP1 to CHIP3 include a plurality of latch units 11_1 to 11_6, 12_1 to 12_6, and 13_1 to 13_6, respectively, which are configured to store a plurality of TSV defect information signals (that is, signals indicating defects in TSVs) outputted from the corresponding repair fuse units. The latch units are allocated to the respective TSVs. The plurality of TSV defect information signals stored in the plurality of latch units 11_1 to 11_6, 12_1 to 12_6, and 13_1 to 13_6 are sequentially transferred to the TSV selection unit 6 through a defect information transfer TSV 4.

In this embodiment of the present invention, it has been described that each of the semiconductor chips CHIP1 to CHIP4 includes the plurality of repair fuse units and the plurality of latch units. However, it is also possible that any one or more of the semiconductor chips includes the plurality of repair fuse units and the plurality of latch units based on design needs.

The operation of the semiconductor device configured in such a manner will be described as follows.

The plurality of latch units 11_1 to 11_6, 12_1 to 12_6, and 13_1 to 13_6 provided in the respective semiconductor chips store a plurality of TSV defect information signals outputted from the repair fuse units of the corresponding semiconductor chip, and sequentially outputs the TSV defect information signals. That is, the plurality of latch units of the corresponding semiconductor chip, which are implemented as shift registers, store a plurality of TSV defect information signals outputted from the corresponding repair fuse units, and then sequentially transfer the stored signals to the defect information transfer TSV 4.

In the following description, it is assumed that a defect has occurred in the first normal TSV 1A among the plurality of TSVs 1A-1B, 2A-2B, and 3A-3B, and the first normal TSV 1A is repaired by using the first redundant TSV 1B.

The first normal TSV 1A for commonly transferring a signal to the plurality of semiconductor chips CHIP1 to CHIP4 physically connects the plurality of semiconductor chips CHIP1 to CHIP4. Therefore, even when a defect occurs in only a portion of the first normal TSV 1A passing through a specific semiconductor chip, a repair operation for the normal TSV 1A is performed in all of the semiconductor chips CHIP1 to CHIP4 such that the normal TSV 1A is substituted with the first redundant TSV 1B. Therefore, repair fuses included in the repair fuse units 21_1 to 23_1 of the respective semiconductor chips, which are allocated to the first normal TSV 1A, are cut by the repair operation and indicate that a repair has occurred for the respective semiconductor chips.

As an example, the internal operations of the repair fuse units 23_1 to 23_3 and the latch units 13_1 to 13_6 provided in the third semiconductor chip CHIP3 will be described. The repair fuse units 23_1 to 23_3 output a plurality of TSV defect information signals that indicate whether the repair fuses are cut or not, and the latch units 13_1 to 13_6 store the outputted TSV defect information signals. Then, the latch units 13_1 to 13_6 sequentially transfer the stored signals to the defect information transfer TSV 4, and the transferred defect information signals are provided to the TSV selection unit 6 through the defect information transfer TSV 4.

Through the plurality of TSV defect information signals, the TSV selection unit 6 selectively drives TSVs for transferring a signal, among the plurality of TSVs 1A-1B, 2A-2B, and 3A-3B. That is, the TSV selection unit 6 selectively drives the redundant TSVs and the normal TSV (which operates in normal conditions), in order to commonly transfer a signal to the plurality of semiconductor chips CHIP1 to CHIP4.

According to an example, the defect information transfer TSV 4 which sequentially transfers the plurality of TSV defect information signals includes a plurality of TSVs (4A and 4B) which are connected through a plurality of connection lines 5_1 to 5_4 in parallel (for example, by using a multi-parallel method). Therefore, reliability for accurately transferring the signals further increases. In such a parallel connection method, however, a large area is occupied. Therefore, the TSVs for transferring the TSV defect information signals may be configured through a single connection line or multiple parallel connection lines as appropriate.

Figure 2:
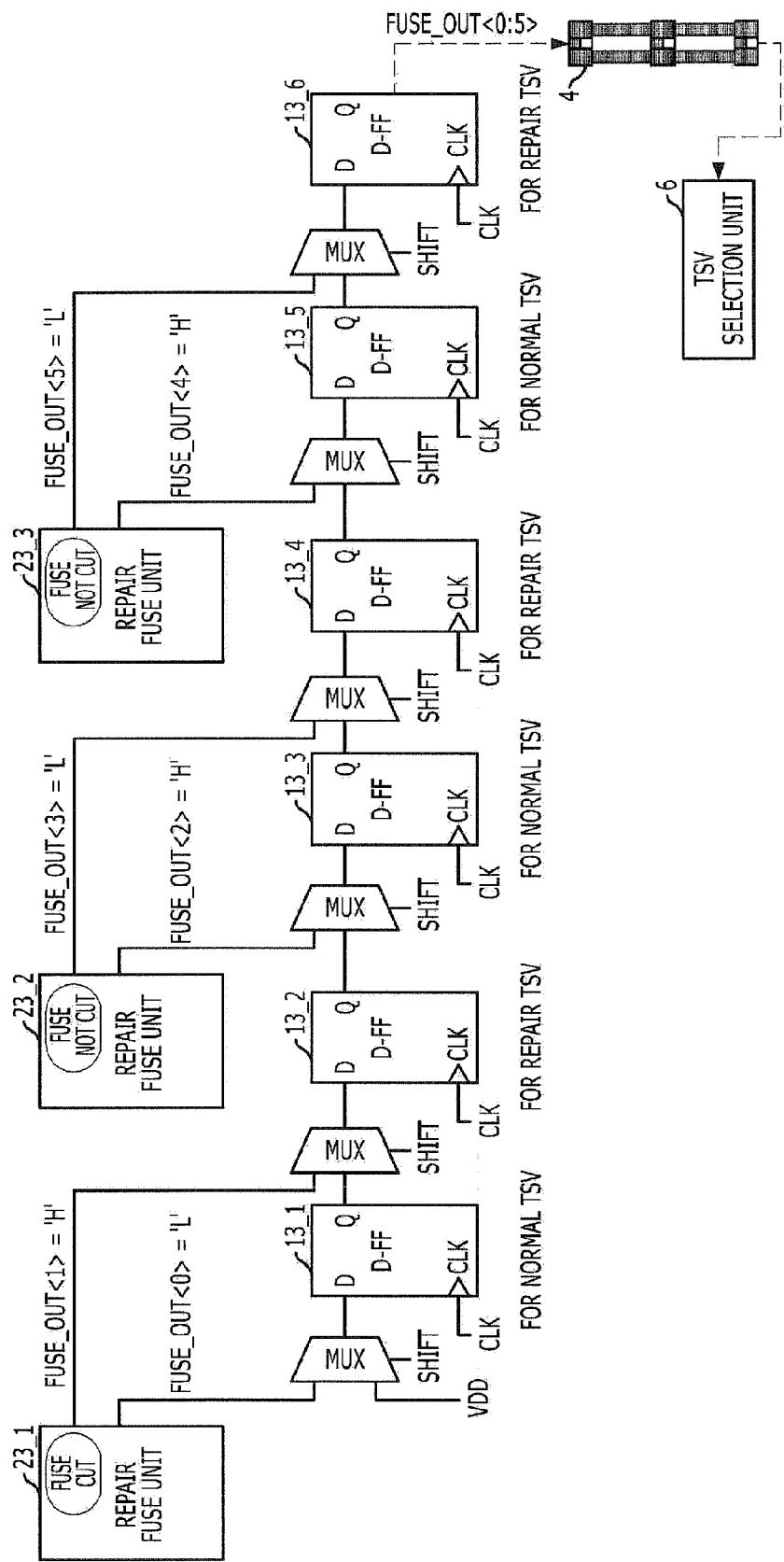
FIG. 2 illustrates an internal circuit of the semiconductor device of FIG. 1.

FIG. 2 illustrates an internal circuit of the semiconductor device of FIG. 1.

Referring to FIG. 2, the internal operations of the repair fuse units 23_1 to 23_3 and the latch units 13_1 to 13_6 provided in the third semiconductor chip CHIP3 are described in detail.

The repair fuse units 23_1 to 23_3 output a plurality of TSV defect information signals FUSE_OUT<0:5> corresponding to whether the repair fuses are cut or not, and the latch units 13_1 to 13_6 store the plurality of TSV defect information signals FUSE_OUT<0:5> outputted from the repair fuse units 23_1 to 23_3.

Since the repair fuse of the first repair fuse unit 23_1 is cut, the first TSV defect information signal FUSE_OUT<0> having a low level is transferred to the first latch unit 13_1 allocated to the first normal TSV 1A, and the second TSV defect information signal FUSE_OUT<1> having a high level is transferred to the second latch unit 13_2 allocated to the first redundant TSV 1B.

Since the repair fuse of the second repair fuse unit 23_2 is not cut, the third TSV defect information signal FUSE_OUT<2> having a high level is transferred to the third latch unit 13_3 allocated to the second normal TSV 2A, and the fourth TSV defect information signal FUSE_OUT<3> having a low level is transferred to the fourth latch unit 13_4 allocated to the second redundant TSV 2B.

Since the repair fuse of the third repair fuse unit 23_3 is not cut, the fifth TSV defect information signal FUSE_OUT<4> having a high level is transferred to the fifth latch unit 13_5 allocated to the third normal TSV 3A, and the sixth TSV defect information signal FUSE_OUT<5> having a low level is transferred to the sixth latch unit 13_6 allocated to the third redundant TSV 3B.

When a shift signal SHIFT is activated, a plurality of multiplexers MUX, while not transferring the output signals of the repair fuse units 23_1 to 23_3 to the latch units 13_1 to 13_6, transfer signals outputted from the latch units to each other to shift the signals through the latch units. When the shift signal SHIFT is activated, the latch units 13_1 to 13_6 operate like shift registers, and sequentially transfer the stored signals through the defect information transfer TSV 4. The plurality of TSV defect information signals FUSE_OUT<0:5> transferred through the defect information transfer TSV 4 are finally provided to the TSV selection unit 6. Through the plurality of TSV defect information signals FUSE_OUT<0:5>, the TSV selection unit 6 selectively drives TSVs among the plurality of TSVs 1A-1B, 2A-2B, and 3A-3B for transferring a signal. That is, the TSV selection unit 6 selectively drives the redundant TSVs and the normal TSV for transferring signals, in order to commonly transfer a signal to the plurality of semiconductor chips CHIP1 to CHIP4.

Hereinafter, a semiconductor system having a stacked structure of a semiconductor device where a plurality of semiconductor chips are stacked, and a controller will be explained with the following drawings.

Figure 3:
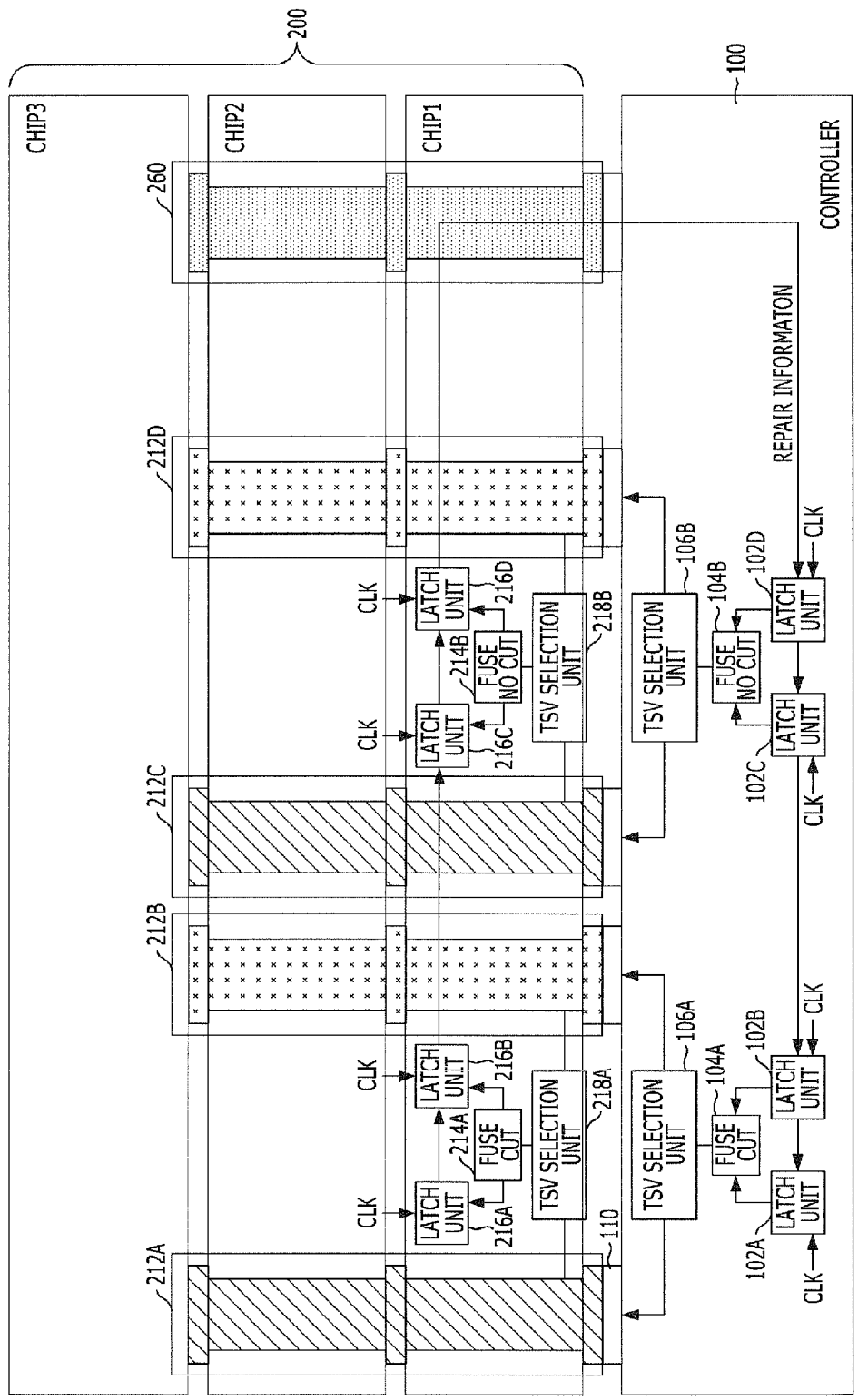
FIG. 3 is a diagram conceptually illustrating a semiconductor system in accordance with a second embodiment of the present invention.

FIG. 3 is a diagram conceptually illustrating a semiconductor system in accordance with a second embodiment of the present invention.

Referring to FIG. 3, the semiconductor system includes a controller 100 and a semiconductor device 200. The semiconductor device 200 is stacked over the controller 100, and comprises a plurality of stacked semiconductor chips CHIP1 to CHIP3 and a plurality of TSVs 212A to 212D which commonly transfer a signal to the plurality of semiconductor chips CHIP1 to CHIP3.

The plurality of TSVs 212A to 212D include a plurality of normal TSVs 212A and 212C, and a plurality of redundant TSVs 212B to 212D, which make a pair. The plurality of TSVs 212A to 212D penetrates the stacked semiconductor chips CHIP1 to CHIP3 to be coupled to the controller 100 through a bump pad 110. For reference, the TSVs between the stacked semiconductor chips CHIP1 to CHIP3 are coupled to each other through another bump pads.

The first semiconductor chip CHIP1 among the plurality of semiconductor chips CHIP1 to CHIP3 comprises a plurality of first repair fuse units 214A and 214B, and a plurality of first latch units 216A to 216D. The first repair fuse units 214A and 214B are allocated to a pair of the normal and redundant TSVs, and set first fuse information in response to a plurality of TSV defect information signals indicating defects in the TSVs. The first latch units 216A to 216D are allocated to the respective TSVs, and store the first fuse information set in the plurality of first repair fuse units 214A and 214B. Further, the first semiconductor chip CHIP1 comprises a plurality of first TSV selection units 218A and 218B which are allocated to a pair of the normal and redundant TSVs, and selectively drive the normal TSVs 212A and 212C and the redundant TSVs 212B and 212D in response to the first fuse information set in the plurality of first repair fuse units 214A and 214B.

Here, the first semiconductor chip CHIP1 may be a master chip while the other semiconductor chips CHIP2 and CHIP3 may be a slave chip. The first semiconductor chip CHIP1 of the master chip may be disposed in the lowermost position of the stacked semiconductor chips CHIP1 to CHIP3.

This embodiment shows that the first semiconductor chip CHIP1 includes the plurality of first repair fuse units 214A and 214B, the plurality of first latch units 216A to 216D, and the plurality of first TSV selection units 218A and 218B. However, in another embodiment, each semiconductor chip may comprise a plurality of repair fuse units, a plurality of latch units, and a plurality of TSV selection units.

Preferably, the first latch units 216A to 216D are composed of a shift register which stores the first fuse information set in the plurality of first repair fuse units 214A and 214B, and sequentially outputs the first fuse information as the plurality of TSV defect information signals to the controller 100 through a defect information transfer TSV 260 in response to a clock signal CLK.

For reference, though this embodiment shows the defect information transfer TSV 260 comprising a single line, the defect information transfer TSV may be composed of a plurality of TSVs which are connected through a plurality of connection lines in parallel (for example, by using a multi-parallel method) according to various embodiments. Therefore, reliability for accurately transferring the signals further increases.

The controller 100 comprises a plurality of second latch units 102A to 102D, a plurality of second repair fuse units 104A and 104B, and a plurality of second TSV selection units 106A and 106B. The plurality of second latch units 102A to 102D are allocated to the respective TSVs, and store the plurality of TSV defect information signals transferred through the defect information transfer TSV 260. The plurality of second repair fuse units 104A and 104B are allocated to a pair of the normal and redundant TSVs, and set second fuse information in response to the plurality of TSV defect information signals. The plurality of second TSV selection units 106A and 106B are allocated to a pair of the normal and redundant TSVs, and selectively drive the normal TSVs 212A and 212C and the redundant TSVs 212B and 212D in response to the second fuse information set in the plurality of second repair fuse units 104A and 104B.

Preferably, the second latch units 102A to 102D are composed of a shift register which sequentially stores the plurality of TSV defect information signals in response to the clock signal CLK.

Hereinafter, an operation of the semiconductor system in accordance with the second embodiment will be described. In the following description, it is assumed that a defect has occurred in the first normal TSV 212A among the normal TSVs 212A and 212C, and the first normal TSV 212A is repaired by using the first redundant TSV 212B. At this time, a repair fuse in the first repair fuse unit 214A, which is allocated to the first normal TSV 212A, is cut by a repair operation.

The plurality of first latch units 216A to 216D provided in the respective semiconductor chip store the first fuse information set in the first repair fuse units 214A and 214B, and sequentially output the first fuse information. That is, the first latch units 216A to 216D are composed of a shift register which stores the first fuse information set in the plurality of first repair fuse units 214A and 214B, and sequentially outputs the first fuse information as the plurality of TSV defect information signals to the controller 100 through the defect information transfer TSV 260.

Then, the plurality of second latch units 102A to 102D provided in the controller 100 store the plurality of TSV defect information signals transferred through the defect information transfer TSV 260 from the semiconductor device 200. The plurality of second repair fuse units 104A and 104B set the second fuse information in response to the plurality of TSV defect information signals. The plurality of second TSV selection units 106A and 106B selectively drive the normal TSVs 212A and 212C and the redundant TSVs 212B and 212D in response to the second fuse information set in the plurality of second repair fuse units 104A and 104B Since the repair fuse in the first repair fuse unit 214A of the semiconductor device 200 allocated to the first normal TSV 212A is cut, a repair fuse in the second repair fuse unit 104A of the controller 100 is cut in response to the respective TSV defect information signal. Accordingly, the second TSV selection unit 106A drives the first redundant TSV 212B instead of the first normal TSV 212A.

Figure 4:
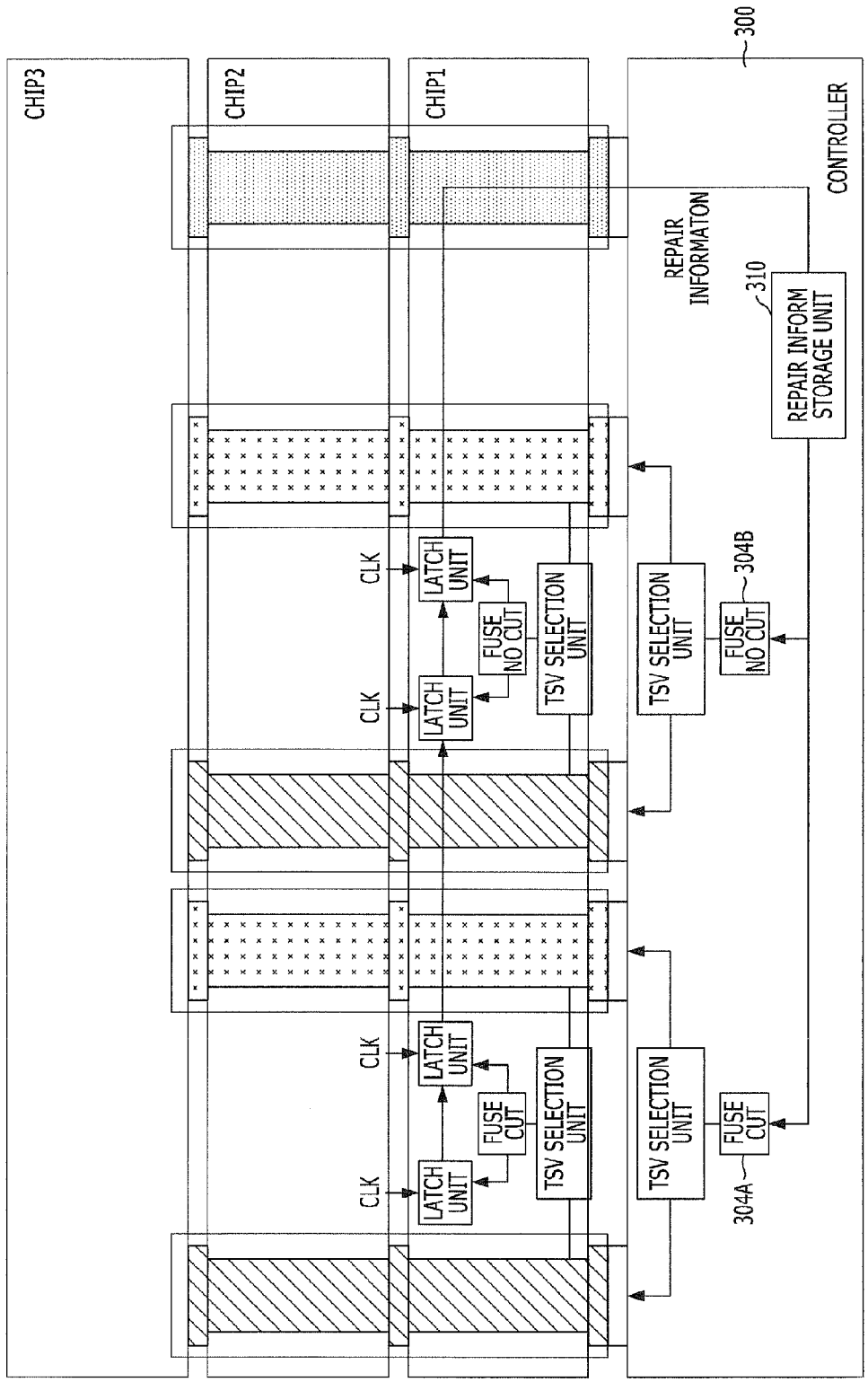
FIG. 4 is a diagram conceptually illustrating a semiconductor system in accordance with a third embodiment of the present invention.

FIG. 4 is a diagram conceptually illustrating a semiconductor system in accordance with a third embodiment of the present invention.

In FIG. 3, each of the plurality of second latch units 102A to 102D provided in the controller 100 corresponds to each of the plurality of first latch units 216A to 216D provided in the first semiconductor chip CHIP1, one to one. On the contrary, in FIG. 4, a repair information storage unit 310 is provided in a controller 300. That is, the repair information storage unit 310 sequentially receives and stores the plurality of TSV defect information signals, and simultaneously transfers the stored TSV defect information signals to a plurality of second latch units 304A and 304B, in response to a clock signal CLK. In accordance with the third embodiment, a constitution is simple and an arrangement of circuits is easy in comparison with the second embodiment shown in FIG. 3.

Figure 5:
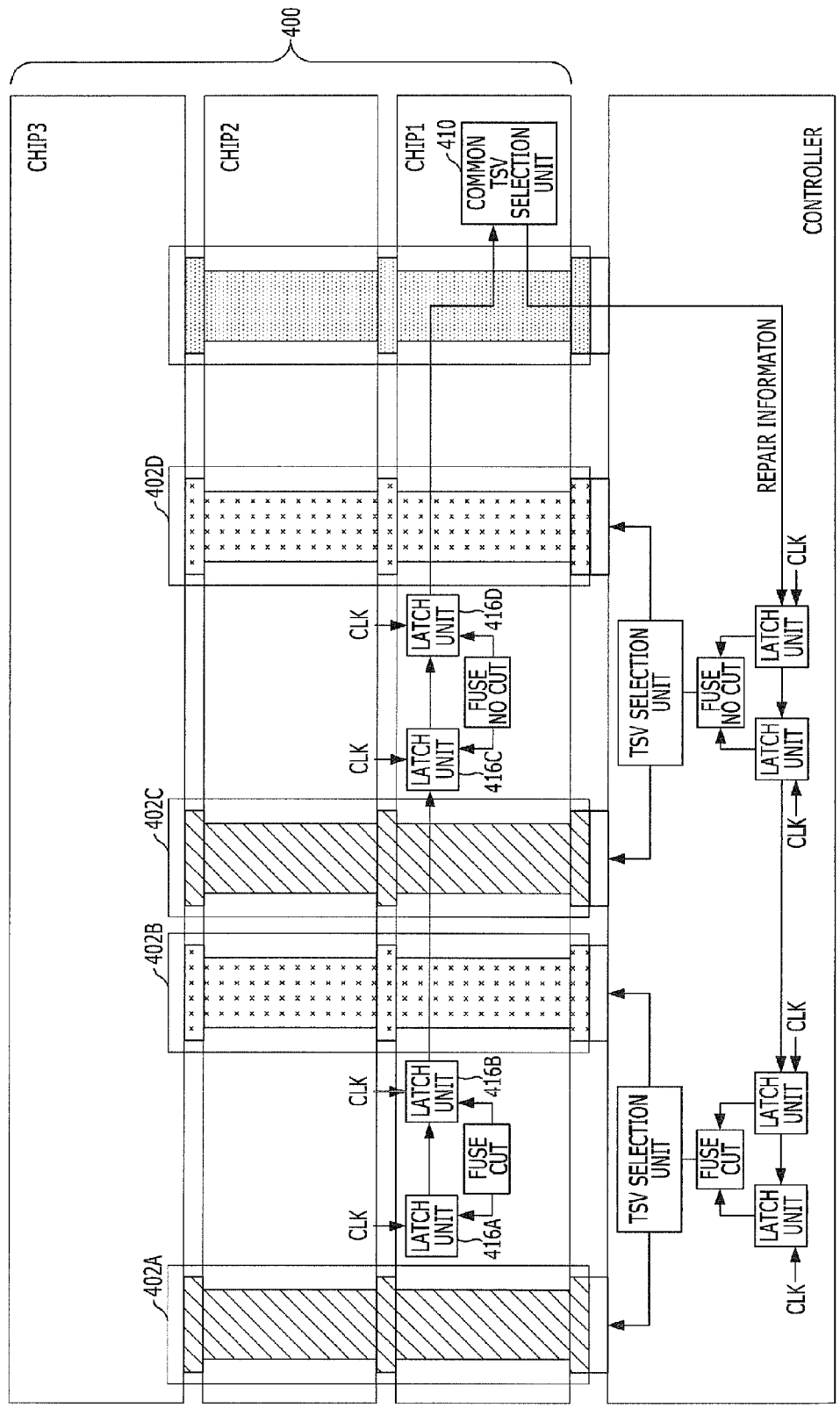
FIG. 5 is a diagram conceptually illustrating a semiconductor system in accordance with a fourth embodiment of the present invention.

FIG. 5 is a diagram conceptually illustrating a semiconductor system in accordance with a fourth embodiment of the present invention.

In FIG. 3, the first TSV selection units 218A and 218B provided in the first semiconductor chip CHIP1 are allocated to a pair of the normal TSVs 212A and 212C and the redundant TSVs 212B and 212D, respectively. On the contrary, in FIG. 5, a common TSV selection unit 410 is provided in a first semiconductor chip CHIP1 of a semiconductor device 400. That is, the common TSV selection unit 410 receives a plurality of TSV defect information signals sequentially transferred from a plurality of first latch units 416A to 416D, and selectively drives normal TSVs 402A and 402C and redundant TSVs 402B and 402D in order to commonly transfer a signal to the plurality of semiconductor chips CHIP1 to CHIP3.

This embodiment shows that the first semiconductor chip CHIP1 includes a plurality of first repair fuse units, a plurality of first latch units, and a common TSV selection unit. However, it is possible that each semiconductor chip may comprise a plurality of repair fuse units and a plurality of latch units, and a master chip, e.g., the first semiconductor chip CHIP1, further comprises a common TSV selection unit, according to various embodiments.

The semiconductor device in accordance with the first embodiment of the present invention may store the defect information (that is, information as to defects) of the TSVs in the plurality of latch units. Furthermore, the semiconductor device sequentially receives the defect information of the TSVs and then selectively drives the TSVs among the plurality of TSVs for transferring a signal.

The semiconductor system in accordance with the second to fourth embodiments of the present invention comprises a semiconductor device and a controller, which are stacked. The semiconductor device sequentially transfers the defect information through a defect information transfer TSV, and the controller selectively drives the TSVs among the plurality of TSVs for transferring a signal in response to the sequentially transferred the defect information.

While the present invention has been described with respect to the specific embodiments, it will be apparent to those skilled in the art that various changes and modifications may be made without departing from the spirit and scope of the invention as defined in the following claims. For example, additional components may be used in addition to the above-described components of the exemplary embodiments of the present invention. Furthermore, the polarity of active high or active low for indicating an activation state of signal or circuit may be changed depending on different design needs. Furthermore, in implementing a same function, different configuration of transistors/elements may be used depending on different design needs.

In other words, PMOS transistors and NMOS transistors may be substituted for each other, and various types of transistors may be used as needed. Furthermore, logic gate combinations may be changed in implementing a same function. For example, NAND unit or NOR unit may be implemented by various combinations of NAND gates, NOR gates, and inverters. Such modifications would be apparent to those skilled in the art. Therefore, the enumeration thereof is omitted.

What is claimed is:

1. A semiconductor system comprising:
   a controller; and
   a semiconductor device comprising a plurality of stacked semiconductor chips stacked over the controller, and a plurality of through-silicon vias (TSVs) configured to commonly transfer a signal to the plurality of stacked semiconductor chips,
   wherein at least one of the semiconductor chips comprises a plurality of first repair fuse units configured to set first fuse information corresponding to a TSV defect information, and sequentially outputs the TSV defect information, and
   the controller comprises a plurality of second repair fuse units configured to set second fuse information based on the sequentially outputted TSV defect information, and selectively drives the TSVs in response to the second fuse information.

2. The semiconductor system of claim 1, wherein at least one of the semiconductor chips further comprises:
   a plurality of first latch units, each allocated to the respective TSVs, configured to store the first fuse information set in the plurality of first repair fuse units.

3. The semiconductor system of claim 2, wherein the plurality of first latch units are composed of a shift register which is controlled by a clock signal.

4. The semiconductor system of claim 2, wherein at least one of the semiconductor chips further comprises:
   a common TSV selection unit configured to sequentially receive the first fuse information outputted from the first latch units, and to selectively drive the TSVs.

5. The semiconductor system of claim 2, wherein the TSVs comprise a plurality of normal TSVs and a plurality of redundant TSVs, which make a pair.

6. The semiconductor system of claim 5, wherein at least one of the semiconductor chips further comprises:
   a plurality of first TSV selection units, each allocated to a pair of the normal and redundant TSVs, configured to receive the first fuse information outputted from the first latch units and to selectively drive the normal TSVs and the redundant TSVs.

7. The semiconductor system of claim 5, wherein the controller further comprises:
   a plurality of second TSV selection units, each allocated to a pair of the normal and redundant TSVs, configured to selectively drive the normal TSVs and the redundant TSVs in response to the second fuse information set in the plurality of second repair fuse units.

8. The semiconductor system of claim 1, wherein the controller further comprises:
   a plurality of second latch units, each allocated to the respective TSVs, configured to store the sequentially outputted TSV defect information.

9. The semiconductor system of claim 8, wherein the plurality of second latch units are composed of a shift register which is controlled by a clock signal.

10. The semiconductor system of claim 8, wherein the controller further comprises:
    a repair information storage unit configured to store the sequentially outputted TSV defect information, and simultaneously transfer the stored TSV defect information to the second latch units in response to a clock signal.

11. The semiconductor system of claim 1, further comprising:
a defect information transfer TSV configured to transfer the sequentially outputted TSV defect information from at least one of the semiconductor chips to the controller.

12. The semiconductor system of claim 11, wherein the defect information transfer TSV includes a plurality of TSVs which are connected through a plurality of connection lines in parallel.

13. A semiconductor system comprising:
a controller;
a semiconductor device comprising a plurality of stacked semiconductor chips stacked over the controller, and a plurality of through-silicon vias (TSVs) configured to commonly transfer a signal to the plurality of stacked semiconductor chips; and
a defect information transfer TSV configured to transfer TSV defect information sequentially outputted from at least one of the semiconductor chips to the controller, wherein the controller comprises:
a plurality of first repair fuse units configured to set first fuse information based on the TSV defect information; and
a plurality of first TSV selection units configured to selectively drive the TSVs in response to the first fuse information.

14. The semiconductor system of claim 13, wherein the controller further comprises:
a plurality of first latch units configured to store the TSV defect information.

15. The semiconductor system of claim 14, wherein the plurality of first latch units are composed of a shift register which is controlled by a clock signal.

16. The semiconductor system of claim 14, wherein the controller further comprises:
a repair information storage unit configured to store the TSV defect information sequentially outputted, and simultaneously transfer the stored TSV defect information to the first latch units in response to a clock signal.

17. The semiconductor system of claim 13, wherein at least one of the semiconductor chips comprises:
a plurality of second repair fuse units configured to set second fuse information corresponding to the TSV defect information; and
a plurality of second latch units configured to store the second fuse information.

18. The semiconductor system of claim 17, wherein the plurality of second latch units are composed of a shift register which is controlled by a clock signal.

19. The semiconductor system of claim 17, wherein at least one of the semiconductor chips further comprises:
a common TSV selection unit configured to sequentially receive the second fuse information outputted from the second latch units, and to selectively drive the TSVs.

20. The semiconductor system of claim 17, wherein the TSVs comprise a plurality of normal TSVs and a plurality of redundant TSVs, which make a pair.

21. The semiconductor system of claim 20, wherein at least one of the semiconductor chips further comprises:
a plurality of second TSV selection units, each allocated to a pair of the normal and redundant TSVs, configured to receive the second fuse information outputted from the second latch units and to selectively drive the normal TSVs and the redundant TSVs.

* * * * *